United States Patent [19]
Murphy et al.

[11] Patent Number: 5,233,242
[45] Date of Patent: Aug. 3, 1993

[54] SUPERCONDUCTING PUSH-PULL FLUX QUANTUM GATE ARRAY CELLS

[75] Inventors: John H. Murphy, Churchill Boro; Michael R. Daniel, Monroeville; John X. Przybysz, Penn Hills, all of Pa.

[73] Assignee: Westinghouse Electric Corp., Pittsburgh, Pa.

[21] Appl. No.: 744,728

[22] Filed: Aug. 14, 1991

[51] Int. Cl.[5] ........................................ H03K 19/195
[52] U.S. Cl. .................................. 307/476; 307/306; 307/462
[58] Field of Search ............... 307/476, 462, 306, 245, 307/277, 262; 505/859, 861; 365/162

[56] References Cited

U.S. PATENT DOCUMENTS

| | | | |
|---|---|---|---|
| 3,740,654 | 6/1973 | Rossbach et al. | 307/236 |
| 3,969,677 | 7/1976 | Woyton | 307/236 |
| 4,371,796 | 2/1983 | Takada | 307/476 |
| 4,413,197 | 11/1983 | Josephs et al. | 307/462 |
| 4,559,459 | 12/1985 | Wang et al. | 307/462 |
| 4,646,060 | 2/1987 | Phillips et al. | 307/277 X |
| 5,019,818 | 5/1991 | Lee | 307/277 X |
| 5,097,143 | 3/1992 | Remson | 307/262 |

FOREIGN PATENT DOCUMENTS

| | | | |
|---|---|---|---|
| 0130863 | 10/1979 | Japan | 367/236 |
| 0020031 | 2/1982 | Japan | 307/306 |
| 0191938 | 10/1984 | Japan | 307/476 |
| 0223221 | 11/1985 | Japan | 307/476 |

OTHER PUBLICATIONS

T. R. Gheewala, "One Device and Gate", IBM Technical Disclosure Bulletin, vol. 21, No. 11, Apr. 1979.
Mukhanov, O. A. et al., "Ultimate Performance of the RSFQ Logic Circuits", IEEE Transactions on Magnetics, vol. MAG-23, 759-762, 1987.
Likharev, K. K. et al., "RSFQ Logic/Memory Family: A New Josephson-Junction Technology for Sub-Terahertz-Clock-Frequency Digital Systems", IEEE Transactions on Applied Superconductivity, vol. 1, No. 1, Mar. 1991.
Likharev, K. K., "Progress and Prospects of Superconductor Electronics", Supercond. Sci. Technol., vol. 3, pp. 325-337, 1990.
Likharev, K. K. et al. "Resistive Single Flux Quantum Logic for the Josephson-Junction Digital Technology", SQUID '85-Superconducting Quantum Interference Devices and Their Applications, Walter de Gruyter & Co., Berlin, 1103-1108, 1985.
Koshelets, V. P. et al., "Experimental Realization of a Resistive Single Flux Quantum Logic Circuit", IEEE Transactions on Magnetics, vol. MAG-23, 755-758, 1987.
Kaplunenko, V. K. et al., "Experimental Study of the RSFQ Logic Elements", IEEE Transactions on Magnetics, vol. MAG-25, 861-864, 1989.
Mukhanov, O. A. et al., "RSFQ Logic Arithmetic", IEEE Transactions on Magnetics, vol. MAG-25, 857-860, 1989.
Mukhanov, O. A. et al., "Recent Development of Rapid Single Flux Quantum (RSFQ) Logic Digital Devices", Extended Abstracts of the 1989 International Superconductivity Electronics Conference (ISEC '89), 557-560, 1989.

Primary Examiner—Eugene R. LaRoche
Assistant Examiner—Son Dinh
Attorney, Agent, or Firm—R. P. Lenart

[57] ABSTRACT

Push-pull flux quantum gate array cells synchronously process a pair of polarized data signals. These polarized data signals can be derived from dual polarity data signals by separating the input signals into positive polarity data signals and negative polarity data signals. At least one logic or arithmetic operation is performed on each of the positive and negative polarity signals to produce modified positive and negative polarity signals respectively. These modified positive polarity and negative polarity signals can also be combined to produce a modified dual polarity output data signal. Numerous logic operations can be achieved in gate array cells which perform this signal processing method. By using push-pull flux quantum circuits, the need for auxiliary timing signals or interferometers is minimized.

28 Claims, 9 Drawing Sheets

SUPERCONDUCTING PUSH-PULL FLUX QUANTUM GATE ARRAY CELLS

BACKGROUND OF THE INVENTION

This invention relates to superconducting circuits and, more particularly, to synchronous, digital superconducting logic circuits.

Josephson junctions have the ability to switch from the zero voltage state to a non-zero voltage state in times on the order of picoseconds, with the switching being limited by the resistive-capacitive time constant of the junction. Both hysteretic and non-hysteretic Josephson junctions have been used to construct high speed circuits having low power dissipation. There are two physical principles upon which data can be stored in Josephson logic systems. The first approach is to encode the stored data as a voltage across the Josephson junction. The second approach is to encode the stored data as magnetic flux trapped in a persistent superconducting loop. The smallest amount of magnetic flux for which the latter approach can be applied is a single flux quantum $\phi_0$.

There are two physical principles upon which data can be transferred throughout a Josephson logic system. The first approach is to encode the data to be transferred as an electric current. The second approach is to encode the data to be transferred as a voltage pulse, V. For single flux quanta, the area of the voltage pulses over a period of time that will allow logic functions to be performed within the superconducting loops is equal to $\phi_0$.

The logic representation used in superconducting circuits is vitally important to how the circuits perform signal inversion. In classical representation, where a logic TRUE is represented by a positive voltage and a logic FALSE is represented by a zero voltage, signal inversion must be accomplished by timed inversion. Since the superconducting phenomena does not support a three terminal transistor-like circuit, all state-of-the-art superconducting digital electronic circuits have only achieved signal inversion by signal interaction with an auxiliary timing signal. This timed inversion feature inherent in state-of-the-art superconducting digital electronic circuits limits their processing speed.

One type of superconducting digital logic circuit encodes a binary unity/zero as the presence/absence of a DC voltage across an unshunted Josephson tunnel junction. With a hysteretic current/voltage curve such "latching" circuits must be AC powered so that they can be reset to the initial superconducting state and this resetting must be slow enough to avoid punch through effects.

A second type of superconducting digital logic circuit uses the presence/absence of a single flux quanta in superconducting quantum interferometers to store the information. Such circuits are termed Resistive or Rapid Single Flux Quantum (RSFQ) circuits. General background information on RSFQ circuits can be found in an article by A. O. Mukhanov et al. entitled, "Ultimate Performance of the RSFQ Logic Circuits.", in IEEE Transactions on Magnetics, Vol. MAG-23, No. 2, March 1987, and an article by K. K. Likharev and V. K. Semenov, entitled "RSFQ Logic/Memory Family: A New Josephson-Junction Technology for SubTeraHertz-Clock-Frequency Digital Systems", in IEEE Transactions on Applied Superconductivity, Vol. 1, No. 1, March 1991.

RSFQ logic circuits are timed or clocked circuits, that is, they need two signals to define the information, a timing signal to define the interval for valid data and a data signal for defining the data being transmitted. This approach slows the speed at which data can be transmitted by a factor of 2. In addition, RSFQ circuits are asynchronous so they must trap and store intermediate calculations for future readout. This feature forces the inclusion of interferometers in each logic circuit. Interferometers, even for single magnetic flux quanta trapping, are spatially large circuits.

It is therefore desirable to devise a family of superconducting digital logic circuits which do not require an AC bias source, a separate timing signal, or the use of interferometers in each logic circuit. A commonly assigned application entitled, "Superconducting Push-Pull Flux Quantum Logic Circuits", filed concurrently herewith (U.S. Ser. No. 744,729), discloses such a family of superconducting digital logic circuits. The present invention seeks to utilize circuits from that family, and variations thereof, to construct gate array cells and to use such cells to perform logical operations on the data.

SUMMARY OF THE INVENTION

Superconducting digital logic circuits constructed in accordance with this invention perform at least one digital logic or arithmetic operation on each of the positive and negative polarity data signals (substantially synchronously) to produce modified positive and negative polarity data signals. These "polarized rail" signals can be produced by separating a dual polarity data input signal into a positive polarity data signal and a negative polarity data signal. The modified signals can be combined to produce a single modified dual polarity polarized output data signal which can serve as the circuit output.

In various embodiments of this invention, one or more dual polarity input signals may be received and the input signals may be separated into sets of positive polarity signals and negative polarity signals. This invention encompasses both superconducting push-pull flux quantum gate array cell circuits and the signal processing methods performed by those circuits.

Circuits constructed in accordance with this invention are faster, smaller, and operate on less power than RSFQ gate array cells which perform similar logic operations. Since push-pull flux quantum superconducting logic circuits utilize non-hysteretic (shunted or crudely manufactured) Josephson tunnel junctions, they can be readily implemented using high temperature (near 77° K.) superconductors.

BRIEF DESCRIPTION OF THE DRAWINGS

The present invention will be more readily apparent to those skilled in the art when discussed in terms of the following circuits illustrative of the preferred embodiments thereof, wherein:

In particular, FIG. 1 is a signal separator;
FIG. 2 is a positive signal repeater;
FIG. 3 is a negative signal repeater;
FIG. 4 is a positive to negative inverter;
FIG. 5 is a negative to positive inverter;
FIG. 6 is a positive signal conjunction;

FIG. 7 is a negative signal conjunction;
FIG. 8 is a positive to negative inverting conjunction;
FIG. 9 is a negative to positive inverting conjunction;
FIG. 10 is a positive signal disjunction;
FIG. 11 is a negative signal disjunction;
FIG. 12 is a dual polarity signal disjunction;
FIG. 13 is a positive to negative inverting disjunction;
FIG. 14 is a negative to positive inverting disjunction;
FIG. 15 is a positive signal splitter; and
FIG. 16 is a negative signal splitter.

FIGS. 17 and 18 are NOT gates;

FIGS. 19 and 20 are AND gates;
FIGS. 21 and 22 are OR gates;
FIGS. 23 and 24 are NAND gates;
FIGS. 25 and 26 are NOR gates;
FIGS. 27 and 28 are three NOR/NAND gate array cells; and
FIGS. 28 and 30 are two OR/AND-NOR/NAND gate array cells.

DESCRIPTION OF THE PREFERRED EMBODIMENTS

Gate array cells constructed in accordance with this invention utilize push-pull flux quanta (PPFQ) logic circuits based on the representation of a logic one or TRUE state by a positive voltage pulse, V(t), which has an area given by:

$$\int V(t)\,dt = +\phi_0 \quad (1)$$

and a logic 0 or FALSE state by a negative voltage pulse, V(t), which has an area given by:

$$\int V(t)\,dt = -\phi_0 \quad (2)$$

where $\phi_0$ ($2.07 \times 10^{-15}$ Webers) is a single flux quantum. By representing both logic states by active voltage pulses, logic can be performed without needing superconducting interferometers to trap the state of computation, nor timing pulses to read and reset the state of the interferometers. PPFQ logic circuits are utilized in the gate array cells of the present invention to separate incoming dual polarity data signals into positive polarity data signals and negative polarity data signals, and to recombine modified versions of the positive and negative polarity data signals to obtain an output signal.

Various logic circuits are used in the construction of the preferred embodiments of the gate array cells of this invention. These circuits are illustrated in FIGS. 1-16.

Figure 1:
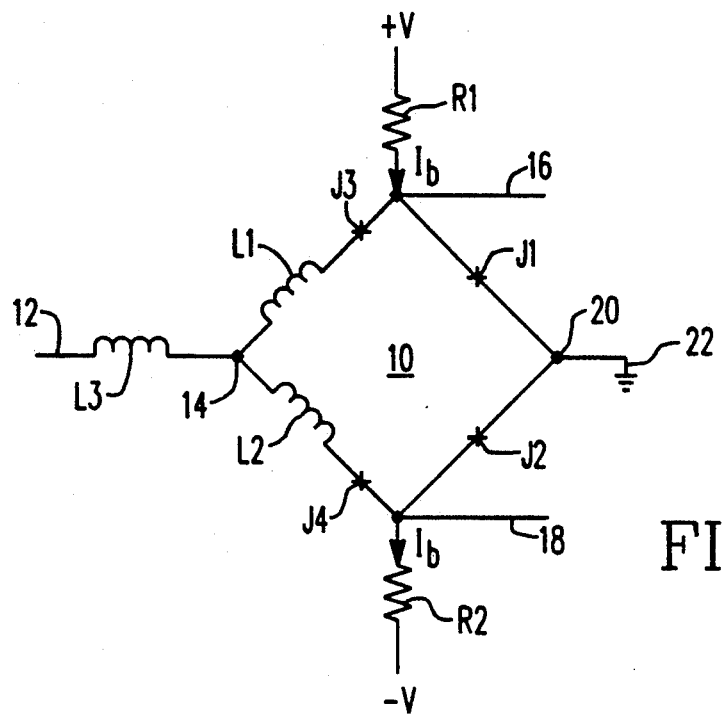
FIGS. 1-16 are schematic diagrams of various circuits which may be used to construct the gate array cells of this invention.

FIG. 1 is a schematic diagram of a signal separator 10 which is used to dissect a dual polarity input voltage signal into a positive polarity signal and a negative polarity signal. A first circuit branch comprising the series connection of Josephson junctions J1 and J2 is electrically connected between a positive and negative, voltage source by way of resistors R1 and R2. A second circuit branch, comprising the series connection of Josephson junctions J3 and J4 and inductors L1 and L2, is electrically connected in parallel with the first circuit branch. An input line 12 is connected to a first node 14 in the second circuit branch by way of inductor L3. Output lines 16 and 18 are used to extract signals at opposite ends of the parallel connection of the first and second circuit branches. A junction point 20 between junctions J1 and J2 is connected by way of conductor 22 to ground.

The bias current $I_b$ is set to about 75% of the Josephson junction critical currents $I_c$. When a positive voltage pulse is present on line 12, this voltage pulse causes junction J1 to momentarily switch off. The switching off of junction J1 causes a reinforced voltage pulse to be present on output line 16. When a negative voltage pulse is present at the input, that voltage pulse causes junction J2 to momentarily switch off. This switching off of junction J2 causes a reinforced negative voltage pulse on output line 18. Finally, when no voltage pulses are present at the input, neither junctions J1 or J2 switch. Therefore, the result is a zero voltage on both outputs. Junctions J3 and J4 isolate the input from the outputs.

Figure 2:
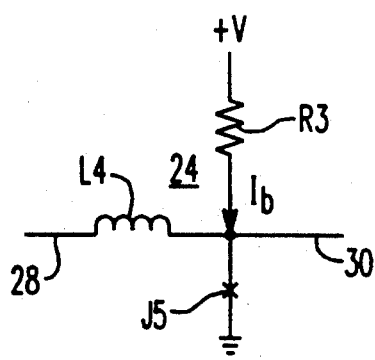
Figure 3:
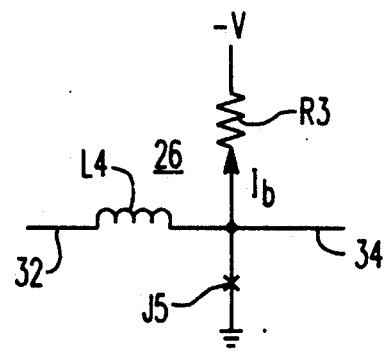

FIGS. 2 and 3 illustrate a positive signal repeater 24 and a negative signal repeater 26. A voltage source, in combination with resistor R3, establishes a bias current $I_b$ at about 75% of the critical current of Josephson junction J5. In FIG. 2, a positive input signal on line 28 passes through inductor L4 and results in a positive output signal on line 30 after a time delay. In FIG. 3, a negative signal on line 32 passes through inductor L4 and results in a negative output signal on line 34. Time delays are used in PPFQ logic circuits to synchronize parallel signal processing.

Figure 4:
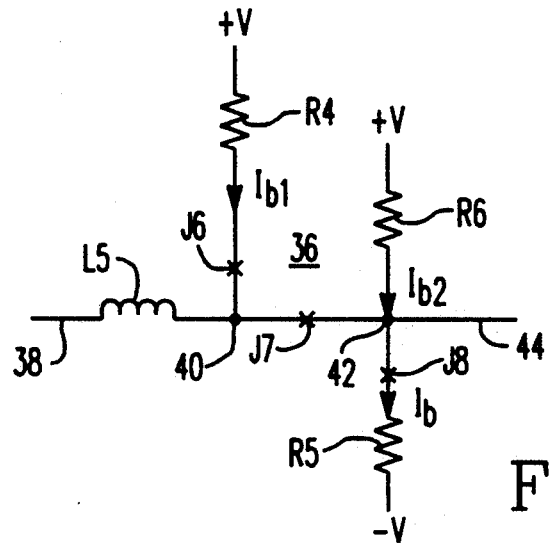

Signal inverters are used to change the polarity of the signal components. Such inverters are required for circuits which do not use dual-rail logic. FIG. 4 is a schematic diagram of a positive to negative signal inverter 36. A circuit branch comprising the series connection of Josephson junctions J6, J7 and J8 is connected between positive and negative voltage sources via resistors R4 and R5 respectively as shown. Again, a bias current $I_b$ is set at about 75% of the Josephson junction critical currents $I_c$. An input line 38 is connected through inductor L5 to a first node 40 in the Josephson junction circuit branch. A second node 42 is connected to an output conductor 44. Resistor R6 connects node 42 to the positive voltage source to provide an additional bias current $I_{b2}$ which results in an amplification of the output signal on line 44. When a positive polarity voltage pulse is present on line 38, this voltage pulse causes Josephson junction J7 to momentarily switch off. This isolates the input from the output and causes a negative voltage pulse to be present on output conductor 44. Junctions J6 and J8 isolate the voltage sources from the input/output signal lines.

Figure 5:
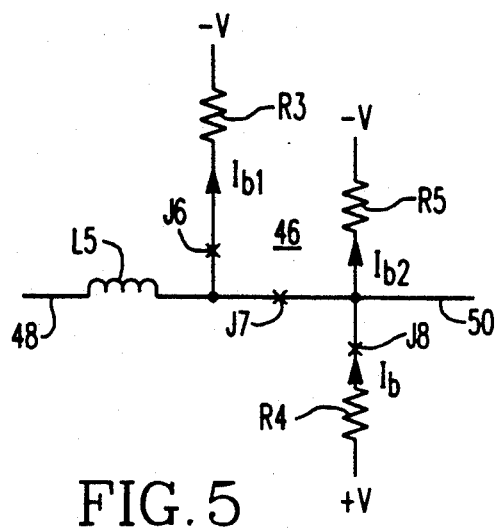

FIG. 5 is a negative to positive inverter 46. This inverter is similar to that of FIG. 4 except that the polarities of the voltage sources have been reversed. In this case, a negative signal on input line 48 results in the production of a positive signal on the output line 50.

Figure 6:
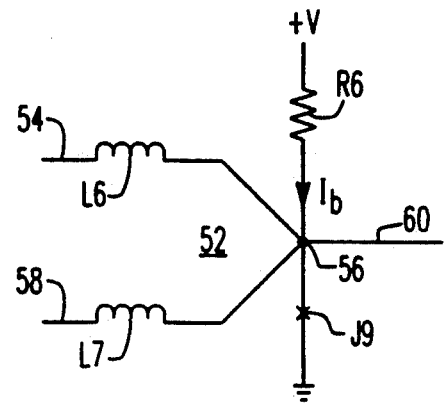
Figure 7:
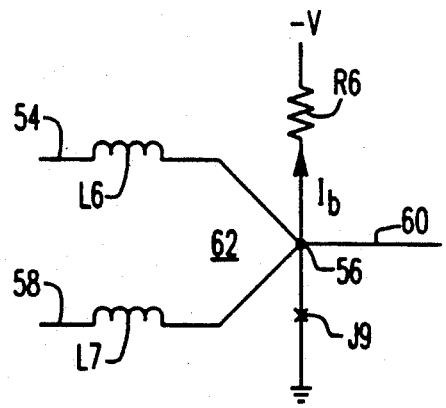

FIG. 6 is a schematic diagram of a positive signal conjunction or hard-wired AND 52. Here again, the voltage source in combination with resistor R6 provides a bias current to junction J9. A string of positive voltage signals on line 54 is connected via inductor L6 to junction point 56. Similarly, a string of positive signals on line 58 is connected via inductor L7 to junction point 56. The output signal on line 60 then consists of the conjoined string of positive signals on lines 54 and 58. FIG. 7 is a negative signal conjunction 62 which is similar to FIG. 6 except that the polarity of the voltage source and input signals have been reversed.

Figure 8:
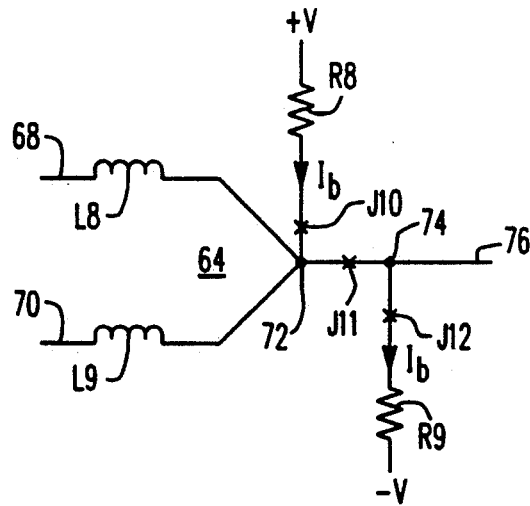
Figure 9:
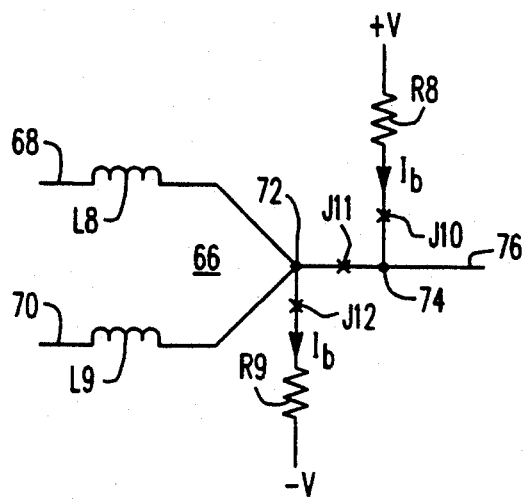

The circuits illustrated in FIGS. 8 and 9 are a positive to negative conjunction 64 and a negative to positive conjunction 66. These circuits are hard-wired NAND circuits which are used to perform logical calculations. Input signals on lines 68 and 70 are coupled to a first node 72 and an output signal at node 74 appears on line 76 as an inverted NAND function of the input signals. The voltage sources, in combination with resistors R8 and R9 supply a bias current to the series connection of Josephson junction J10, J11 and J12. Inductors L8 and L9 couple the signals on lines 68 and 70 respectively to node 72.

Figure 10:
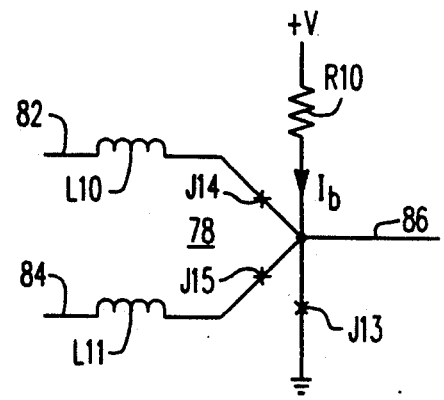
Figure 11:
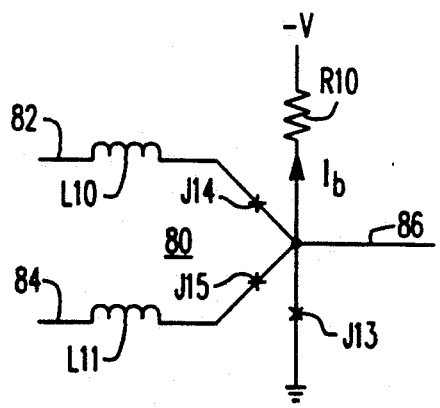

FIGS. 10 and 11 are a positive disjunction or hard-wired OR 78 and a negative disjunction or hard wired OR 80. Here again, the voltage source in combination with resistor R10 sets a bias current $I_b$ through junction J13. In FIG. 10, a positive signal on line 82 is disjoined with a positive signal on line 84 to produce an OR output signal on line 86. In FIG. 11, a negative input signal on line 82 is disjoined with a negative input signal on line 84 to produce a OR output signal on line 86. Junctions J14 and J15 serve to isolate the two input data streams from each other.

Figure 12:
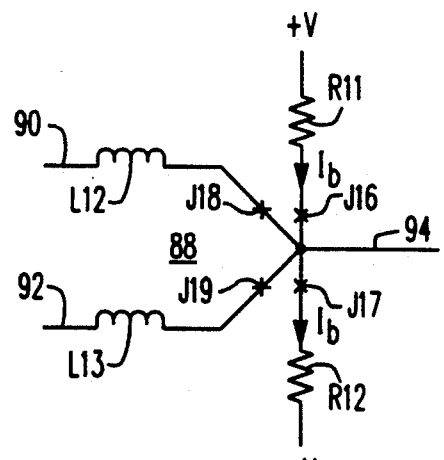

FIG. 12 is a schematic diagram of a dual polarity voltage signal disjunction 88 which allows a string of positive signals on either lines 90 or 92 to be combined with a string of orthogonal negative signals on either lines 90 or 92. The voltage sources in combination with resistors R11 and R12 set a bias current $I_b$ through the series connection of junctions J16 and J17. These junctions are designed to switch and form the disjunctive output on line 94. Junctions J18 and J19 are inserted in series with inductors L12 and L13 respectively to isolate the inputs.

Figure 13:
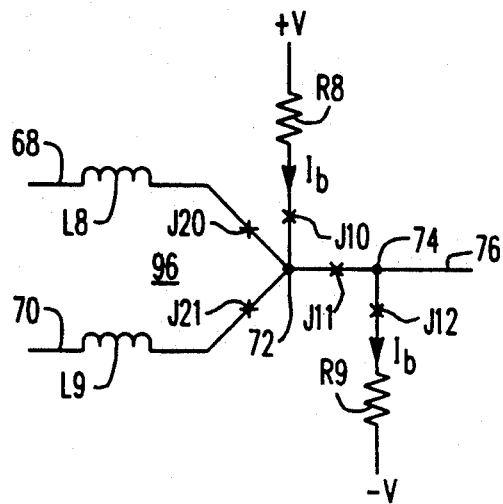
Figure 14:
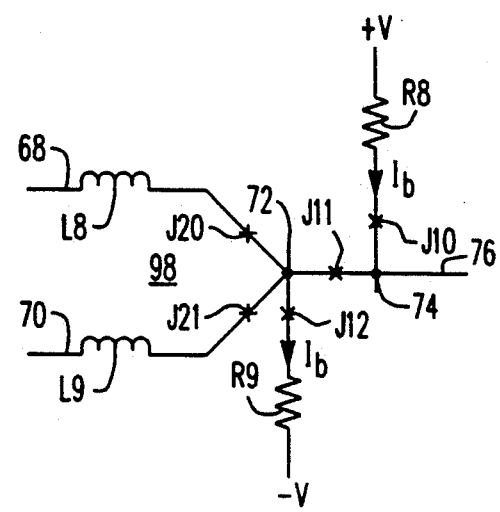

The schematic diagrams of FIGS. 13 and 14 show a positive to negative disjunction 96 and a negative to positive disjunction 98 respectively. These circuits are similar to those of FIGS. 8 and 9 except that Josephson junctions J20 and J21 have been inserted in the input lines 68 and 70 respectively. The input signals on lines 68 and 70 are coupled to a first node 72 in the circuit branch comprising Josephson junctions J10, J11 and J12. Node 74 serves as an output point for the connection of an output conductor 76. The circuits of FIGS. 13 and 14 are hard-wired NOR circuits.

Figure 15:
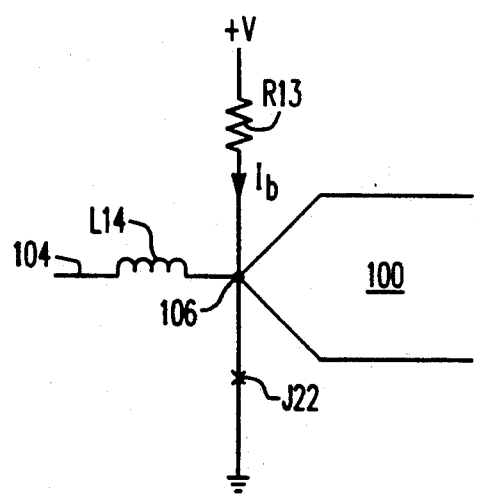
Figure 16:
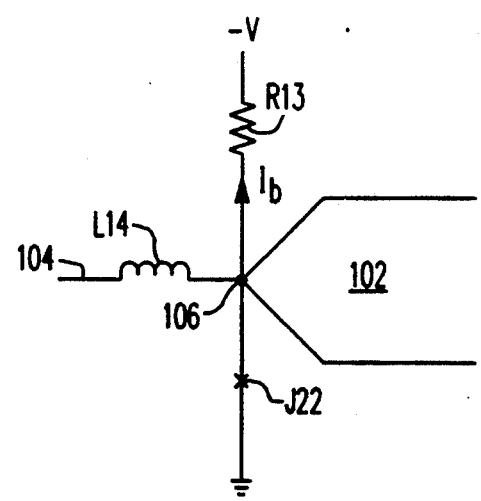

Another element needed to build PPFQ logic circuits is a signal splitter which forms duplicate copies of the signal. FIG. 15 is a positive signal splitter while FIG. 16 is a negative signal splitter. These circuits are identical except for the reversal of polarity of the supply voltage. Signal splitters operate in a manner similar to that of signal repeaters. The major differences are that the, bias current in Josephson junction J22 set by resistor R13 is twice as large such that $I_b$ equals 1.5 $I_c$ and the junction critical currents are twice as large, as the corresponding critical currents for the junctions used in the repeaters of FIGS. 2 and 3. Doubling the bias current and the junction critical currents can be used to increase the fanout of any device described. , This feature is of particular importance to circuits for building NOT, AND, OR, NAND and NOR gates, but will also be of value to build more complex circuits because the time delay for computation can be minimized. In FIG. 15, a positive signal applied to line 104 is connected to node 106 via inductor L14. In FIG. 16, a negative signal on line 104 is connected to node 106 via inductor L14.

The basic approach involved in the gate array cells of this invention includes the separation of all incoming signals into their positive pulse and negative pulse components. If dual polarity signals are used, this can be accomplished by using a signal separator such as that illustrated in FIG. 1. This allows logic or arithmetic operations to be individually performed on the two single polarity pulse signals. In the computation of signal outputs, when a signal of the opposite polarity is required, signal inversion elements are utilized. If a duplicate copy of a signal is required, then signal splitters are used. To synchronize the parallel processing of pulses within the gate array cell, time delays are accomplished with signal repeaters. Logical AND and OR operations are performed on the single polarity pulses by using disjunctions and conjunctions, or inverting disjunctions and inverting conjunctions. Finally, after forming the positive and negative polarity pulses associated with the desired output, these two component results may be combined together. This may be done by a signal disjunction as illustrated in FIG. 12.

The procedure for designing a PPFQ logic gate in accordance with this invention is as follows. First write down the truth table for the desired logic gate. From this truth table, derive the equation for the positive logic circuit and then derive the equation for the negative logic circuit. Done correctly, these two equations are equivalent expressions. From these two equations, the internal layout of the logic gate circuitry can be derived. To illustrate this approach, the design for an AND gate will be discussed. Table 1 is the desired truth table for an AND gate.

TABLE 1

| AND Gate Truth Table | | |
|---|---|---|
| A | B | C |
| 0 | 0 | 0 |
| 0 | 1 | 0 |
| 1 | 0 | 0 |
| 1 | 1 | 1 |

By examining, this truth table, we find that the positive logic equation defining the positive pulse output, C, is given by:

$$C = A \cdot B \quad (3)$$

whereas, the negative logic equation defining the negative pulse output, $\overline{C}$, is given by:

$$\overline{C} = \overline{A} + \overline{B} \quad (4)$$

Figure 18:
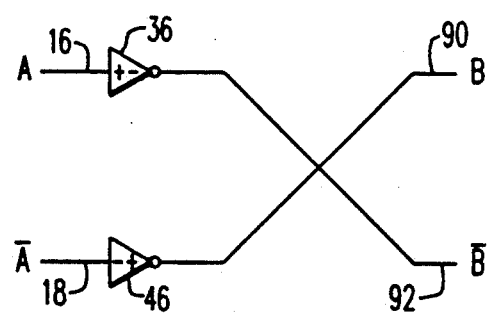

The second equation is the complementary form of the first equation. From these two equations, the internal layout can be made. The positive logic equation indicates that the circuit processing the positive voltage pulses must combine the positive A pulses with the positive B pulses using a positive signal conjunction (a hard-wired AND). The negative logic equation indicates that circuit processing the negative voltage pulses must combine the negative A pulses with the negative B pulses using a negative signal disjunction (hard-wired OR). FIG. 18 represents the circuit layout for an AND circuit resulting from this simple methodology.

The schematic diagrams of FIGS. 17 through 30 represent various gate array cells constructed in accordance with this invention. In these diagrams, the symbols represent various circuits as described in FIGS. 1 through 16. The numbers assigned to these circuits and their input and output lines in FIGS. 17 through 30 are identical to the numbers assigned to these elements in FIGS. 1 through 16.

Figure 17:
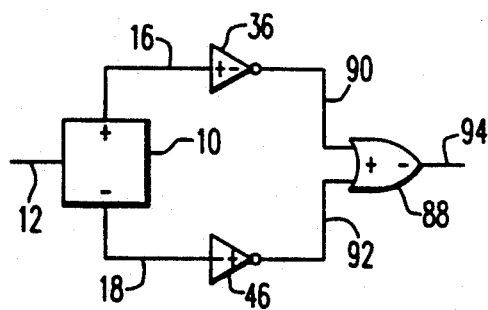
FIGS. 17-30 illustrate gate array cells constructed in accordance with this invention. In particular.

FIG. 17 is a NOT gate. A dual polarity signal on input line 12 is separated into a positive polarity signal on line 16 and a negative polarity signal on line 18. Each of these signals is inverted and the modified signals on lines 90 and 92 (where 92 is the positive rail result and 90 is the negative rail result) are combined in dual polarity disjunction 88 to get an output on line 94. FIG. 18 is a polarized-rail NOT gate in which a positive-rail input signal A produces a negative-rail result $\overline{B}$ and a negative-rail input signal $\overline{A}$ produces a positive-rail result B.

Figure 19:
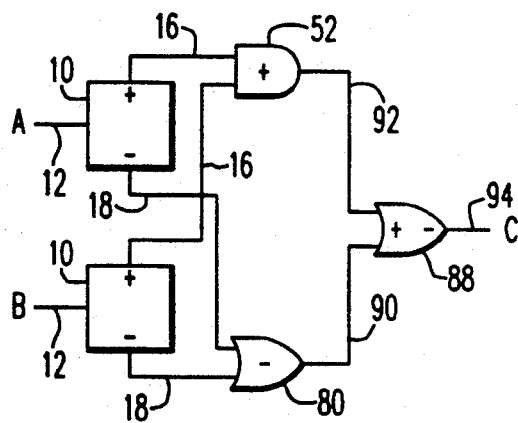
Figure 20:
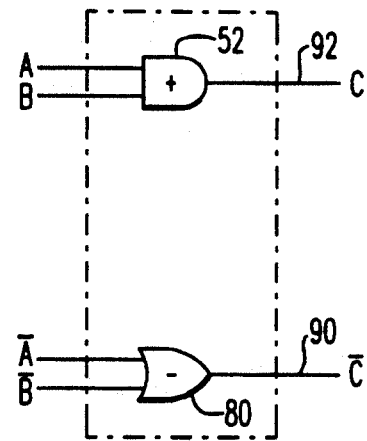
Figure 21:
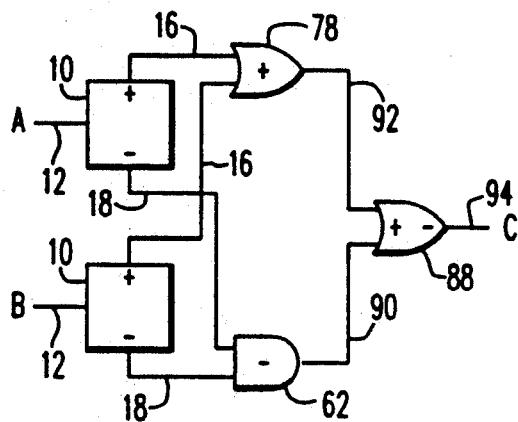
Figure 22:
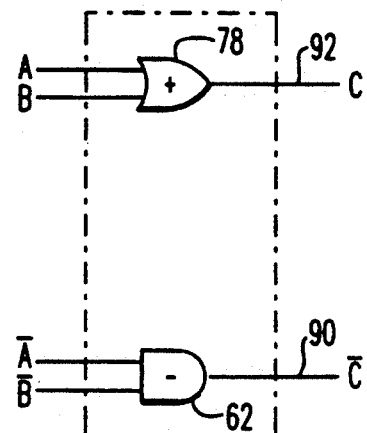
Figure 23:
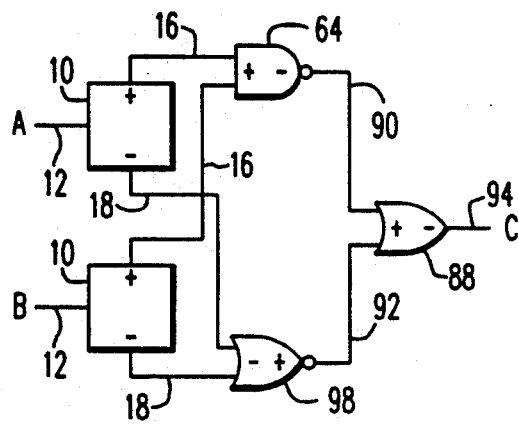
Figure 24:
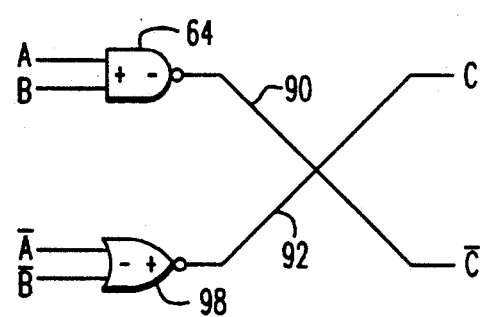
Figure 25:
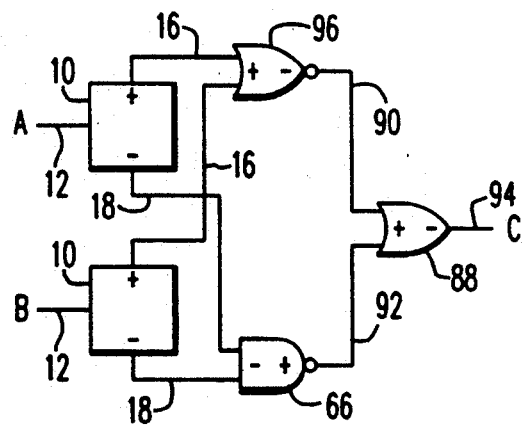
Figure 26:
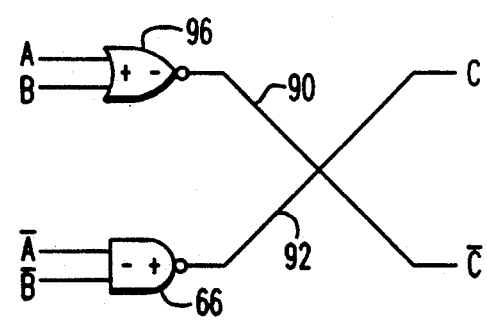

A similar signal processing technique is utilized by FIGS. 19 through 30. PPFQ circuits are simple circuits to transform from one form into another. By simply reversing the polarity of the power supplies, positive/-negative-logic AND's become negative/positive-logic OR's, negative/positive-logic NAND's become positive/negative-logic NOR's, and vice versa. Because of this duality of the PPFQ logic gates, both AND and OR gates can be referred to as OR/AND gates. Similarly, both NAND and NOR gates can be referred to as NOR/NAND gates. This feature of PPFQ circuits can be exploited to form highly flexible standard cells for building gate arrays. Several such cells are illustrated in FIGS. 19, 21, 23, 25, 27 and 29. Each of these cells utilizes the same signal processing technique as illustrated with respect to FIG. 17. That is, a dual polarity input signal is received on one or more input lines, the input to signal or signals are separated into positive polarity and negative polarity components, arithmetic or logical operations are performed on the positive and negative polarity signal components to modify them, and the modified positive and negative polarity signal components are combined in a dual polarity signal disjunction to produce an output signal. FIGS. 20, 22, 24, 26, 28 and 30 are polarized-rail circuits which utilize the signal processing technique illustrated by FIG. 18. These circuits do not include signal splitting and combining stages. FIGS. 19 and 20 are AND gates, FIGS. 21 and 22 are OR gates, FIGS. 23 and 24 are NAND gates, and FIGS. 25 and 26 are NOR gates.

Figure 27:
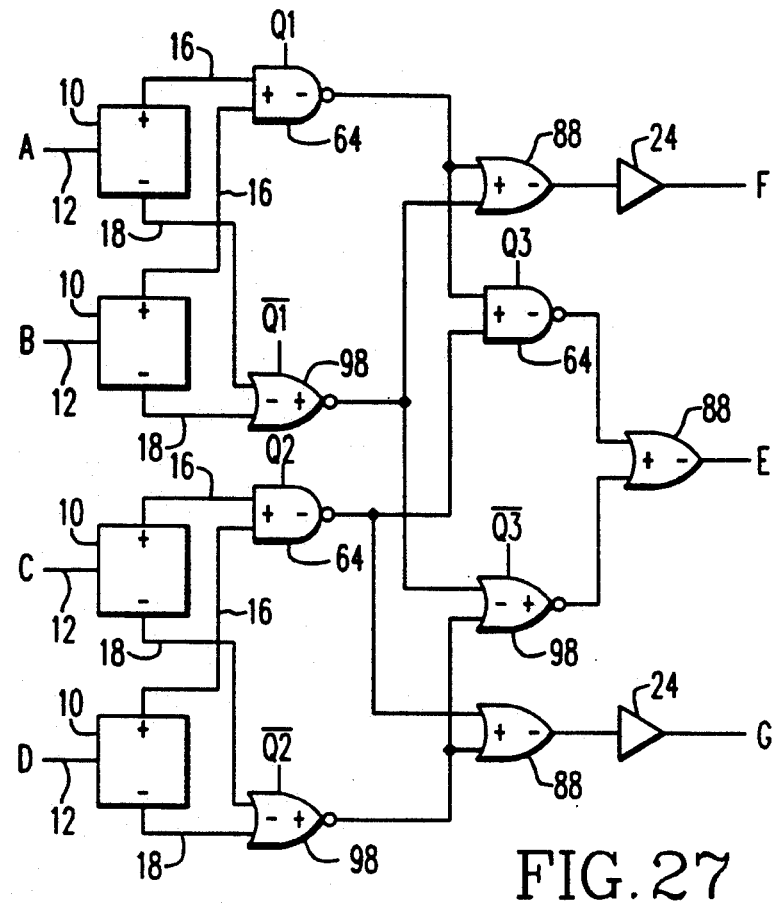
Figure 28:
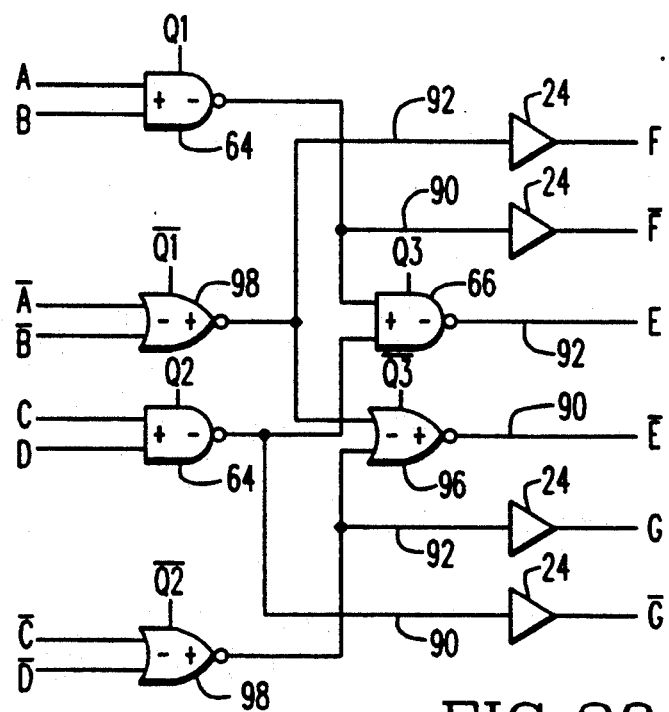
Figure 29:
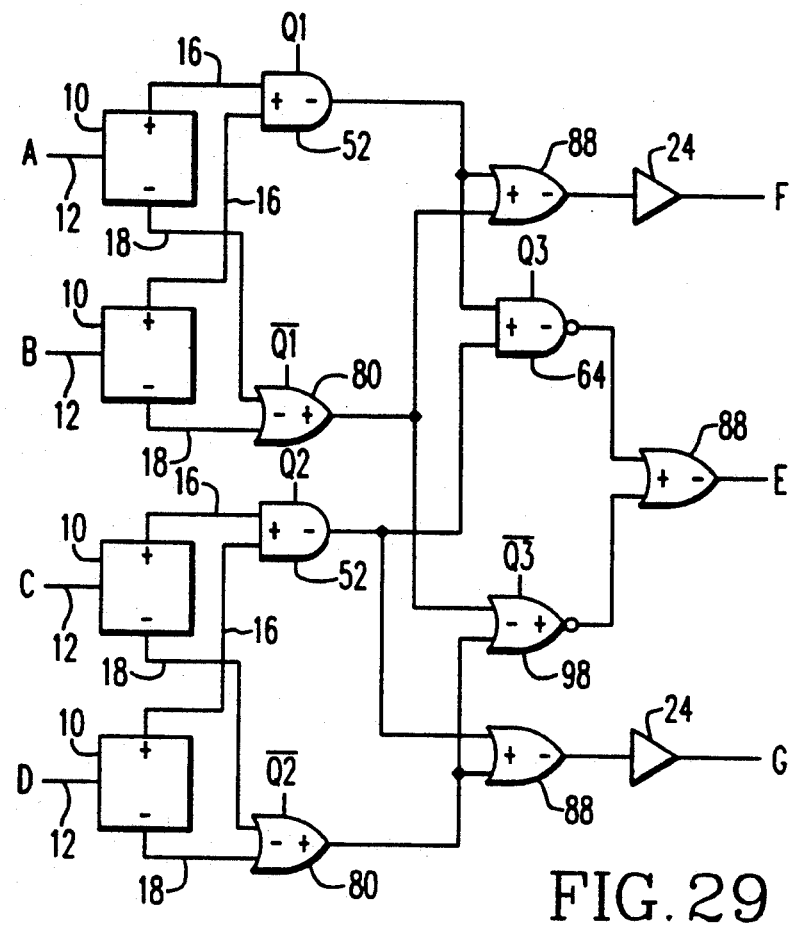
Figure 30:
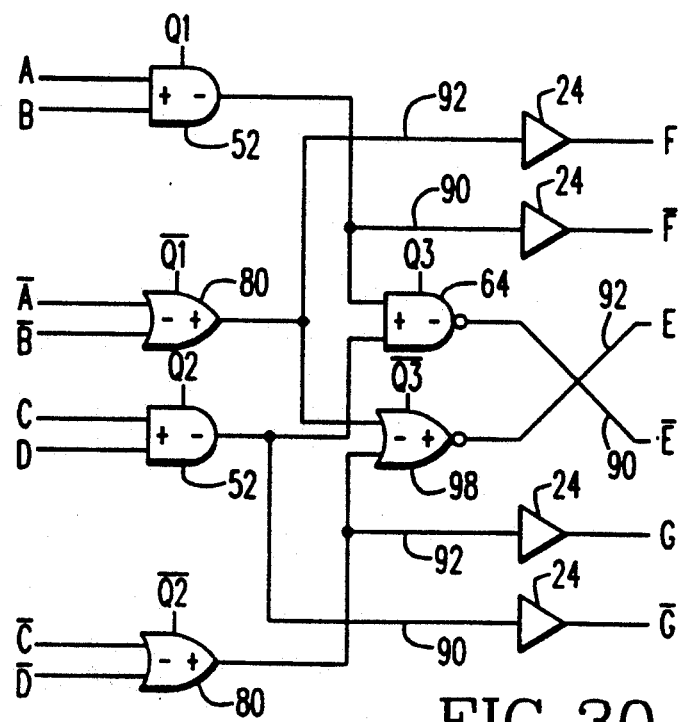

FIGS. 27, 28, 29 and 30 represent more complex gate array cells which are suitable for building digital circuits. FIGS. 27 and 28 are three NOR/NAND gate array cells and FIGS. 29 and 30 are two OR/AND-NOR/NAND gate array cells. These circuits are not simply combinations of the NOR/NAND and OR/AND gates illustrated in FIGS. 17 through 26, but are high speed, compact versions resulting from synergism exploited in the basic circuit design. In particular, the circuits of FIGS. 27 and 29 only separate the dual polarity signal into a single polarity component once. Likewise, these circuits only combine the unipolarity signals into a dual polarity signal once. This approach reduces the time required to perform the desired logic and the space needed to implement the logic. Signal repeaters have been added to these circuits to synchronize the output signals. These added resources may be eliminated if the design of the circuits keeps track of the signal delays. Tables 2 and 3 list the possible logic combinations which may be performed with the circuits of FIGS. 27 and 29 respectively.

The Q1 power supply connection determines the polarity of the power supplied to the upper pair of (inverting) conjunctions and (inverting) disjunctions. The Q2 power supply determines the polarity of the power supply to the lower pair of (inverting) conjunctions and (inverting) disjunctions. The Q3 power supply connection determines the polarity of the power supplied to the middle pair of (inverting) conjunctions and (inverting) disjunctions. As the output logic indicates, these gates are suitable for building compact gate array circuits.

Figure 31:
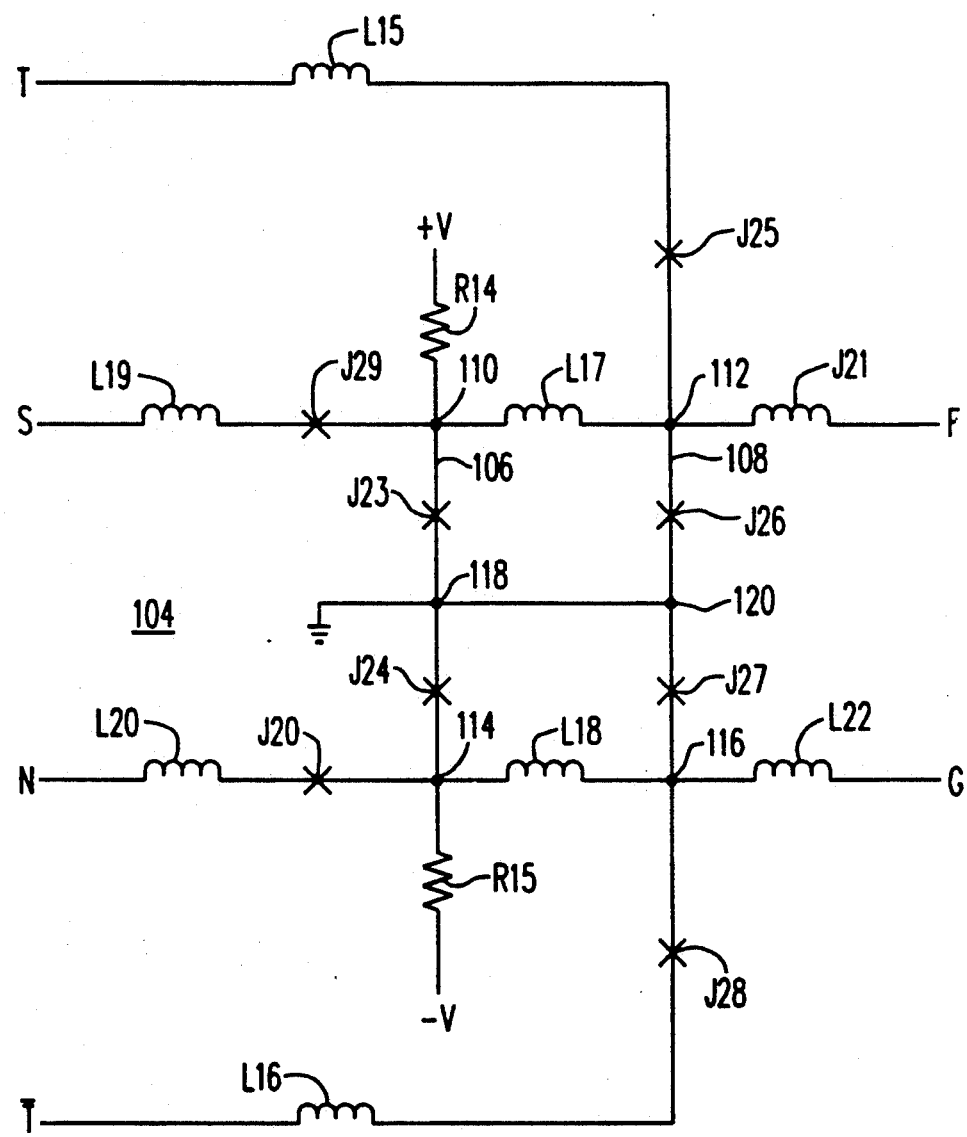
FIG. 31 is a synchronizing circuit.

FIG. 31 is a synchronizing circuit 104 which may be used to synchronize the positive and negative polarity data signals used in the circuits of this invention. A first circuit branch 106, including the series connection of resistors R14 and R15, and Josephson junctions J23 and J24, is connected between positive and negative power supplies as shown. A second circuit branch 108 includes the series connection o Josephson junctions J25, J26, J27 and J28, and inductors L15 and L16. A first junction point 110 in circuit branch 106 is connected to a first junction point 112 in circuit branch 108, by inductor L17. A second junction point 114 in circuit branch 106 is connected to a second junction point 116 in circuit branch 108, by inductor L18. A

TABLE 2

Logic Table for the 3NOR/NAND Gate Array Cell

| POWER CONNECTION POLARITY | | | OUTPUT LOGIC | | |
|---|---|---|---|---|---|
| Q1 | Q3 | Q2 | F | E | G |
| Positive | Positive | Positive | A NOR B | (A NOR B) NOR (C NOR D) | C NOR D |
| Positive | Positive | Negative | A NOR B | (A NOR B) NOR (C NAND D) | C NAND D |
| Positive | Negative | Positive | A NOR B | (A NOR B) NAND (C NOR D) | C NOR D |
| Positive | Negative | Negative | A NOR B | (A NOR B) NAND (C NAND D) | C NAND D |
| Negative | Positive | Positive | A NAND B | (A NAND B) NOR (C NOR D) | C NOR D |
| Negative | Positive | Negative | A NAND B | (A NAND B) NOR (C NAND D) | C NAND D |
| Negative | Negative | Positive | A NAND B | (A NAND B) NAND (C NOR D) | C NOR D |
| Negative | Negative | Negative | A NAND B | (A NAND B) NAND (C NAND D) | C NAND D |

TABLE 3

Logic Table for the 2 OR/AND-NOR/NAND Gate Array Cell

| POWER CONNECTION POLARITY | | | OUTPUT LOGIC | | |
|---|---|---|---|---|---|
| Q1 | Q3 | Q2 | F | E | G |
| Positive | Positive | Positive | A OR B | (A OR B) NOR (C OR D) | C OR D |
| Positive | Positive | Negative | A OR B | (A OR B) NOR (C AND D) | C AND D |
| Positive | Negative | Positive | A OR B | (A OR B) NAND (C OR D) | C OR D |
| Positive | Negative | Negative | A OR B | (A OR B) NAND (C AND D) | C AND D |
| Negative | Positive | Positive | A AND B | (A AND B) NOR (C OR D) | C OR D |
| Negative | Positive | Negative | A AND B | (A AND B) NOR (C AND D) | C AND D |
| Negative | Negative | Positive | A AND B | (A AND B) NAND (C OR D) | C OR D |
| Negative | Negative | Negative | A AND B | (A AND B) NAND (C AND D) | C AND D | third junction point 118 in circuit branch 106 is connected to ground, as is a third junction point 120 in circuit branch 108. Timing signals T and $\overline{T}$ are supplied to opposite ends of circuit branch 108. A first polarized data signal S is supplied to junction point 110 via the series connection of inductor L19 and Josephson junction J29. A second polarized data signal N is supplied to junction point 114 via the series connection of inductor L20 and Josephson junction J30. Output signals F and G are obtained from junction points 112 and 116 via inductors L21 and L22.

The PPFQ gate array cells of this invention can be readily implemented using high temperature (near 77° K.) superconductors when these materials become available because of the use of non-hysteretic (shunted or crudely manufactured) Josephson tunnel junctions. Although the present invention has been described in terms of its preferred embodiments, it will be apparent to those skilled in the art that various changes may be made without departing from the scope of the invention. It is therefore intended that the appended claims cover such changes.

We claim:

1. A method of processing signal in a superconducting circuit, said method comprising the steps of:
   performing in one superconducting circuit at least one digital logic or arithmetic operation on a positive polarity data signal; and
   substantially synchronously performing in another superconducting circuit at least one digital logic or arithmetic operation on a negative polarity data signal.

2. A method of processing signals in a superconducting circuit, said method comprising the steps of:
   separating a dual polarity data signal into a positive polarity data signal and a negative polarity data signal;
   performing at least one digital logic or arithmetic operation on said positive polarity data signal to produce a first modified polarity data signal;
   performing at least one digital logic or arithmetic operation on said negative polarity data signal to produce a second modified polarity data signal; and
   combining said first modified polarity data signal and said second modified polarity data signal to produce a modified dual polarity data signal.

3. A superconducting circuit comprising:
   superconducting means for performing at least one digital logic or arithmetic operation on a positive polarity data signal; and
   superconducting means for substantially synchronously performing at least one digital logic or arithmetic operation on a negative polarity data signal.

4. A superconducting circuit comprising:
   means for separating a dual polarity data signal into a positive polarity data signal and a negative polarity data signal;
   means for performing at least one digital logic or arithmetic operation on said positive polarity data signal to produce a first modified polarity data signal;
   means for performing at least one digital logic or arithmetic operation on said negative polarity data signal to produce a second modified polarity data signal; and
   means for combining said first and second modified polarity data signals to produce a modified dual polarity data signal.

5. A superconducting circuit as recited in claim 4, further comprising:
   means for synchronizing the positive and negative polarity data signals.

6. A superconducting circuit as recited in claim 4, wherein:
   said first modified polarity data signal has a positive polarity; and
   said second modified polarity data signal has a negative polarity.

7. A superconducting circuit as recited in claim 4, wherein:
   said first modified polarity data signal has a negative polarity; and
   said second modified polarity data signal has a positive polarity.

8. A superconducting inverter circuit comprising:
   a first superconducting inverter for inverting a set of positive polarity signals; and
   a second superconducting inverter for substantially synchronously inverting a set of negative polarity signals.

9. A superconducting inverter circuit comprising:
   a first signal splitter for separating a dual polarity input signal into a set of positive polarity signals and a set of negative polarity signals;
   a first inverter for inverting said set of positive polarity signals;
   a second inverter for inverting said set of negative polarity signals; and
   a disjunction for combining an output signal from said first inverter with an output signal from said second inverter.

10. A superconducting logic circuit comprising:
    a first conjunction for combining first and second sets of polarized data signals; and
    a first disjunction for substantially synchronously combining third and fourth sets of polarized data signals;
    wherein said first and second sets of polarized data signals have a positive polarity; and said third and fourth sets of polarized data signals have a negative polarity.

11. A superconducting logic circuit, as recited in claim 10, wherein:
    said first conjunction is powered by a positive polarity power source; and
    said first disjunction is powered by a negative polarity power source.

12. A superconducting logic circuit, as recited in claim 10, wherein:
    said first and second sets of polarized data signals have a negative polarity; and
    said third and fourth sets of polarized data signals have a positive polarity.

13. A superconducting logic circuit, as recited in claim 12, wherein:
    said first conjunction is powered by a negative polarity power source; and
    said first disjunction is powered by a positive polarity power source.

14. A superconducting AND gate comprising:
    a first signal splitter for separating a first dual polarity input signal into a first set of positive polarity signals and a first set of negative polarity signals;
    a second signal splitter for separating a second dual polarity input signal into a second set of positive polarity signals and a second set of negative polarity signals;

a first conjunction for combining said first and second sets of positive polarity signals;

a first disjunction for combining said first and second sets of negative polarity signals; and a second disjunction for combining an output signal from said first conjunction with an output signal from said first disjunction.

15. A superconducting OR circuit comprising:

a first signal splitter for separating a first dual polarity input signal into a first set of positive polarity signals and a first set of negative polarity signals;

a second signal splitter for separating a second dual polarity input signal into a second set of positive polarity signals and a second set of negative polarity signals;

a first disjunction for combining said first and second sets of positive polarity signals;

a first conjunction for combining said first and second sets of negative polarity signals; and a second disjunction for combining an output signal from said first conjunction with an output signal from said first disjunction.

16. A superconducting logic circuit comprising:

a first inverting conjunction for combining first and second sets of polarized data signals; and a first inverting disjunction for substantially synchronously combining third and fourth sets of polarized data signals.

17. A superconducting logic circuit, as recited in claim 16, wherein:

said first and second sets of polarized data signals have a positive polarity; and said third and fourth sets of polarized data signals have a negative polarity.

18. A superconducting logic circuit, as recited in claim 17, wherein:

said first inverting conjunction is a positive to negative inverting conjunction; and said first inverting disjunction is a negative to positive inverting disjunction.

19. A superconducting logic circuit, as recited in claim 16, wherein:

said first and second sets of polarized data signals have a negative polarity; and said third and fourth sets of polarized data signals have a positive polarity.

20. A superconducting logic circuit, as recited in claim 19, wherein:

said first inverting conjunction is a negative to positive inverting conjunction; and said first inverting disjunction is a positive to negative inverting disjunction.

21. A superconducting NAND gate comprising:

a first signal splitter for separating a first dual polarity input signal into a first set of positive polarity signals and a first set of negative polarity signals;

a second signal splitter for separating a second dual polarity input signal into a second set of positive polarity signals and a second set of negative polarity signals;

a first inverting conjunction for combining said first and second sets of positive polarity signals;

a first inverting disjunction for combining said first and second sets of negative polarity signals; and a second disjunction for combining an output signal from said first conjunction with an output signal from said first disjunction.

22. A superconducting NOR gate comprising:

a first signal splitter for separating a first dual polarity input signal into a first set of positive polarity signals and a first set of negative polarity signals;

a second signal splitter for separating a second dual polarity input signal into a second set of positive polarity signals and a second set of negative polarity signals;

a first inverting disjunction for combining said first and second sets of positive polarity signals;

a first inverting conjunction for combining said first and second sets of negative polarity signals; and a second disjunction for combining an output signal from said first conjunction with an output signal from said first disjunction.

23. A superconducting three NOR/NAND gate array cell comprising:

a first inverting conjunction for combining said first and second sets of positive polarity signals;

a second inverting conjunction for combining said third and fourth sets of positive polarity signals;

a first inverting disjunction for combining said first and second sets of negative polarity signals;

a second inverting disjunction for combining said third and fourth sets of negative polarity signals;

a third inverting disjunction for combining an output signal from said first inverting disjunction with an output signal from said second inverting disjunction;

a third inverting conjunction for combining an output signal from said first inverting conjunction with an output signal from said second inverting conjunction.

24. A superconducting three NOR/NAND gate array cell comprising:

a first signal splitter for separating a first dual polarity input signal into a first set of positive polarity signals and a first set of negative polarity signals;

a second signal splitter for separating a second dual polarity input signal into a second set of positive polarity signals and a second set of negative polarity signals;

a third signal splitter for separating a third dual polarity input signal into a third set of positive polarity signals and a third set of negative polarity signals;

a fourth signal splitter for separating a fourth dual polarity input signal into a fourth set of positive polarity signals and a fourth set of negative polarity signals;

a first inverting conjunction for combining said first and second sets of positive polarity signals;

a second inverting conjunction for combining said third and fourth sets of positive polarity signals;

a first inverting disjunction for combining said first and second sets of negative polarity signals;

a second inverting disjunction for combining said third and fourth sets of negative polarity signals;

a first disjunction for combining an output signal from said first inverting conjunction with an output signal from said first inverting disjunction;

a second disjunction for combining an output signal from said second inverting conjunction with an output signal from said second inverting disjunction;

a third inverting disjunction for combining an output signal from said first inverting disjunction with an output signal from said second inverting disjunction;

a third inverting conjunction for combining an output signal from said first inverting conjunction with an output signal from said second inverting conjunction; and a third disjunction for combining an output signal from said third inverting conjunction with an output signal from said third inverting disjunction.

25. A superconducting three NOR/NAND gate array cell as recited in claim 24, further comprising:
a first buffer for delaying an output signal from said first disjunction; and
a second buffer for delaying an output signal from said second disjunction.

26. A superconducting two OR/AND-NOR/NAND gate array cell comprising:
a first conjunction for combining said first and second sets of positive polarity signals;
a second conjunction for combining said third and fourth sets of positive polarity signals;
a first disjunction for combining said first and second sets of negative polarity signals;
a second disjunction for combining said third and fourth sets of negative polarity signals;
a third disjunction for combining an output signal from said first conjunction with an output signal from said first disjunction;
a fourth disjunction for combining an output signal from said second conjunction with an output signal from said second disjunction;
a first inverting disjunction for combining an output signal from said first disjunction with an output signal from said second disjunction;
a first inverting conjunction for combining an output signal from said first conjunction with an output signal from said second conjunction; and
a fifth disjunction for combining an output signal from said first inverting conjunction with an output signal from said first inverting disjunction.

27. A superconducting two OR/AND-NOR/NAND gate array cell comprising:
a first signal splitter for separating a first dual polarity input signal into a first set of positive polarity signals and a first set of negative polarity signals;
a second signal splitter for separating a second dual polarity input signal into a second set of positive polarity signals and a second set of negative polarity signals;
a third signal splitter for separating a third dual polarity input signal into a third set of positive polarity signals and a third set of negative polarity signals;
a fourth signal splitter for separating a fourth dual polarity input signal into a fourth set of positive polarity signals and a fourth set of negative polarity signals;
a first conjunction for combining said first and second sets of positive polarity signals;
a second conjunction for combining said third and fourth sets of positive polarity signals;
a first disjunction for combining said first and second sets of negative polarity signals;
a second disjunction for combining said third and fourth sets of negative polarity signals;
a third disjunction for combining an output signal from said first conjunction with an output signal from said first disjunction;
a fourth disjunction for combining an output signal from said second conjunction with an output signal from said second disjunction;
a first inverting disjunction for combining an output signal from said first disjunction with an output signal from said second disjunction;
a first inverting conjunction for combining an output signal from said first conjunction with an output signal from said second conjunction; and
a fifth disjunction for combining an output signal from said first inverting conjunction with an output signal from said first inverting disjunction.

28. A superconducting two OR/AND-NOR/NAND gate array cell as recited in claim 27, further comprising:
a first buffer for delaying an output signal from said third disjunction; and
a second buffer for delaying an output signal from said fourth disjunction.

* * * * *